United States Patent [19]

Lenhart et al.

[11] 4,035,637

[45] July 12, 1977

[54] FLUID ACTUATED LIGHT SWITCH

[75] Inventors: Ronald A. Lenhart, Lakewood; Timothy W. Rickard, Golden, both of Colo.

[73] Assignee: Zot Manufacturing Company, Lakewood, Colo.

[21] Appl. No.: 643,712

[22] Filed: Dec. 23, 1975

[51] Int. Cl.² .......................................... G01D 5/34
[52] U.S. Cl. ............................ 250/231 P; 250/215
[58] Field of Search ............... 250/231 P, 215, 573, 250/561, 231 R; 317/125; 200/82 C

[56] References Cited

U.S. PATENT DOCUMENTS

| 3,039,833 | 6/1962 | Farkas | 200/82 C |
|---|---|---|---|
| 3,072,766 | 1/1963 | Roth | 250/215 |
| 3,159,750 | 12/1964 | Kazan | 250/215 |
| 3,449,535 | 6/1969 | Otto et al. | 200/82 C |
| 3,516,279 | 6/1970 | Maziarka | 200/82 C |
| 3,724,913 | 4/1973 | Levy | 250/215 |

Primary Examiner—Alfred E. Smith
Assistant Examiner—David K. Moore
Attorney, Agent, or Firm—C. B. Messenger

[57] ABSTRACT

An electric switch and signal output device for use in fluid systems. A light source and photosensitive pickup are disposed in aligned positions in a cross bore of the switch body at opposite sides of a main bore that reciprocally receives a piston element. If fluid subjected to differential pressures is introduced to the main bore at one side of the piston or if fluid is introduced to opposite sides thereof, pressure pulses or changes in differential pressure in the fluid system cause movement of the piston away from or toward an interfering position with respect to the light path between said light source and pickup. Incident light at the pickup, which may be a photocell resistor, provides an output electrical signal change that is usable for control, position indicating, counting or logic purposes. The actuation sensitivity is changed by use of different weight pistons and/or by use of adjustable resilient means. The switch is adaptable for use with dashpot type devices where the incremental pressures resulting from dashpot movement provides the input signal. Use on an automatic pinsetter bowling machine is described.

7 Claims, 8 Drawing Figures

FLUID ACTUATED LIGHT SWITCH

BACKGROUND OF THE INVENTION

Changes in pressure influences are experienced in many fluid systems. For various installations such pressure changes may be desired or undesirable depending on uses of the individual systems. Whether the pressure changes are purposely induced or not, it is often desirable to have a signal output indicating the occurrence of such pressure changes. Control systems, position indicating and other devices can be provided of a signal indication is available to indicate the occurrence of fluid pulse, changes in differential pressure or other similar changes in the system operation. Since electrical instrumentation and control components are extensively available, it is desirable to provide an electrical signal output that is responsive to changes in fluid pressures. Various air switches that may be diaphragm or piston operated have previously been used and devised to satisfy user requirements. The most extensive previous development has been in fields providing devices that are sensitive to larger pressure differentials, but it is further acknowledged that extensive development has also been accomplished in low pressure pneumatic systems where the flow of air may be used for control, counting or logic purposes.

The present inventors have previously been concerned with the provision and use of an air switch type device in automatic pinsetter bowling machines. One such device is shown in U.S. Pat. No. 3,790,167 by the same inventors. In the mentioned patent disclosure a diaphragm operated type of air switch is used together with time delay components to actuate pinsetter, bowling scorer and other components. User experiences with diaphragm type switches indicate that improved sensitivity and reliability features are desirable for use in the field of low pressure electric switch or signal output apparatus.

SUMMARY OF THE INVENTION

The present invention provides a fluid operated electric switch and signal ouput device that may be made in small size for actuation by minor pressure pulses that is further adaptable for use at either low or at a relatively wide range of pressure differentials. In operation the weight of a positon or the total force acting thereon is balanced against an input pressure. If the pressure differential or an input pressure increment is of adequate value, the piston is moved toward or away from a position of interference with respect to a light source and its associated photocell pickup. The alternate interruptions and/or passage of light from the source to the pickup can provide an output electrical signal that is used for control, instrumentation, counting or other purposes. The required actuating force that acts on the piston to cause reciprocal movement thereof may be adjusted through provision of: pistons of changed weight, resilient elements for opposing piston movement that are of variable rate and preload, or through introduction of counterbalancing differential pressure influences on opposite sides of the piston. Embodiments of the invention may be used for a multitude of purposes, and use in machine tool control systems, position indicating operations, and counting systems are shown. Use in an automatic pinsetter bowling machine is further shown and described to further exemplify the adaptability of such device.

DESCRIPTION OF THE PREFERRED EMBODIMENTS

Figure 1:
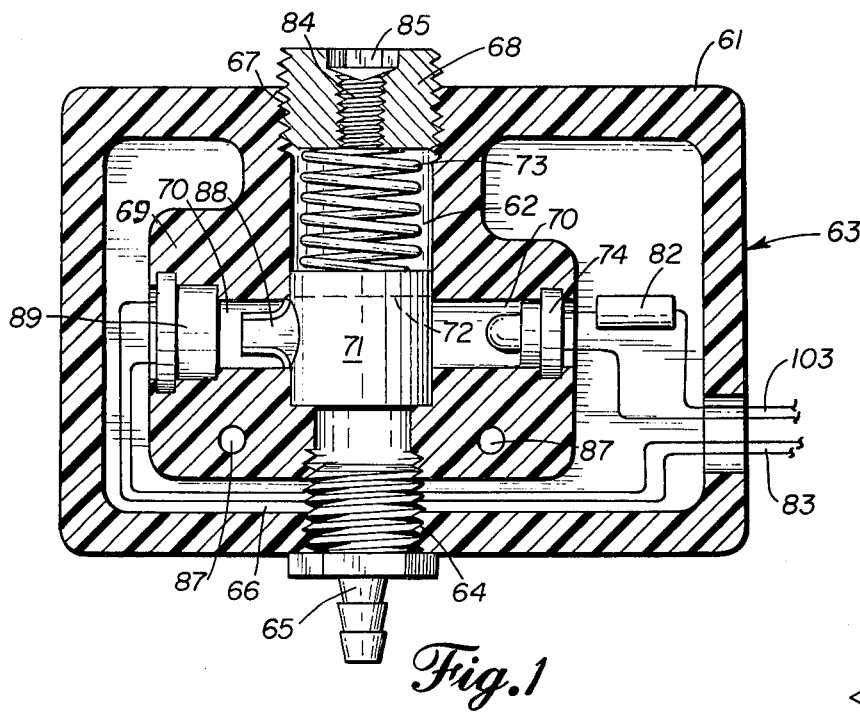
FIG. 1 is a front cross-sectional elevation of a preferred embodiment air switch made in accordance with this invention.

A preferred embodiment of an air switch 63 made in accordance with this invention is shown in FIG. 1, wherein the illustration is approximately twice the actual size. The air switch, which is accordingly of rather small size, is made up of separable halves that are of near identical construction with only one case half 61 being illustrated. In use mated half cases 61 are held together by the insertion of screws or other fasteners through paired and aligned openings 87.

The case halves, which are preferably made of molded plastic material, are assembled to provide a cylindrical central bore 62 that extends through the total width of the case. At an input end the case halves have threads 64 that are adapted to receive an air fitting 65. When in place, the fitting 65 extends past a channel 66 provided in case 61 through which wiring connections are extended. At an outlet end the case halves provide threads 67 adapted to receive an adjustment plug 68. The central section 69 of the case 61 has a cross bore 70 that intersects the cylindrical central bore 62 at a position aligned with the axis of said central bore 62. The cross bore 70 may be of smaller size than said central bore, as illustrated.

A piston 71 of size and shape for close mating reception in central bore 62 is disposed in the central bore for reciprocal movement to alternate positions. In the position illustrated by the full line representation, the piston 71 closes off the passage through the cross bore 70. If the piston 71 is moved to an elevated position against the forces of gravity as indicated by the alternate position dash lines 72, a sight path will be opened through the cross bore 70. In many uses of the air switch 63, the switch will be positioned as illustrated with the inlet end disposed downwardly. For such installation the weight of the piston 71 will itself tend to return the piston to its cross bore interfering position. For installations in other positions of orientation or where higher air pressures are to be encountered, a spring 73 may be provided for disposition within the central bore 62 intermediate the piston 71 and the adjustment plub 68. The forces of compression spring 73 can be biased to hold the piston 71 in its first or interfering position.

The first or main purpose of the present air switch embodiment is to provide an electrical output signal at any time that an increased fluid pressure is present in a fluid system. The conversion from an input fluid pulse to an output electrical signal is obtained through the combined use of a light source and a photocell resistor disposed in the cross bore 70 at opposite sides of the central bore 62 and its piston 71. For the embodiment illustrated a light emitting diode (L.E.D.) 74 is disposed in the central body 69 at one end of the cross bore 70, and a photocell resistor pickup element 89 is disposed at the opposite end of said cross bore. If electrical power is provided to L.E.D. 74 by the input wires 103 and through auxiliary resistor 82, the L.E.D. will be lighted. The light emitted will be transmitted along the cross bore 70 for reception by the photocell resistor 89 if the piston 71 is in its alternate non-interfering position. Oppositely, the light transmission will be cut off when the piston is in its lower or interfering position. In order to avoid the introduction of false signals, a light filter or shield 88 can be provided in the cross bore 70 adjacent the photocell resistor 89.

The changed output of the photocell resistor is delivered by the output wires 83 to an external position for use as position-signal indicator that a pressure pulse has been experienced that is sufficient to raise the piston 71 against the forces of gravity and plus any spring or balance pressure force that may have been present in the central bore 62 at a place above the piston 71. If the air switch is to be used in relatively low pressure installations, the weight of the piston itself can be sufficient to avoid the transmission of false signals. For this type of installation a vent opening will be required so that air otherwise entrapped above the piston 71 can be discharged. In FIG. 1 such a required vent is provided by the threaded central bore 84 in the adjustment plug 68. A socket receptable 85 is also provided by such plug so that spring tensioning adjustments can be made. For installations in which the air switch is to be used to indicate changes in differential pressures, the primary fluid pressure is introduced beneath the piston 71 through the input end of the case and air fitting 65. A secondary fluid pressure can then be introduced through a fitting engaged in the adjustment plug bore 84.

For an air switch having an overall case size of 1θ inches by 2 inches, L.E.D. 74 has a diameter of approximately 0.2 inches and the photocell 89 has a diameter of approximately 0.35 inches. Accordingly, a compact installation is provided. For the mentioned installation an L.E.D. No. 521-9200 manufactured by Dialight Corporation has been used, while the photocell resistor used is a Model VT-342L as provided by Vactec, Inc. For such installation the auxiliary resistor 82 is of 1,800 to 2,000 ohms.

Figure 2:
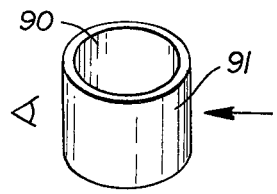
FIG. 2 is a perspective drawing showing an alternate piston construction.
Figure 3:
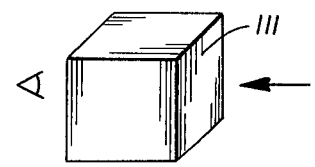
FIG. 3 is a perspective illustration of a square piston.
Figure 4:
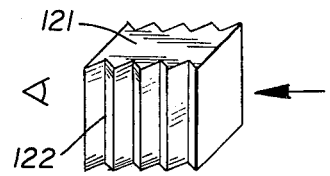
FIG. 4 is a perspective illustration of a piston having crenulated sidewalls.

For the embodiment shown in FIG. 1 the piston 71 is of solid metal. Where a solid brass cylindrical piston is used having a diameter of 0.443 inches and a height of 0.437 inches, a differential fluid pressure of approximately 3 oz. per square inch is sufficient to raise the piston a distance sufficient to initiate a signal. Alternate pistons of separate weight can be provided to adjust the sensitivity of the air switch. One alternate type of piston is shown in FIG. 2. Here cup formed piston 91 having a hollow center 90 can be of substantially less weight especially if made of formed plastic material. The hollow center 90 can be disposed toward the inlet or outlet sides of the switch. If hollow center 90 is disposed toward the outlet a longer spring 73 may be used, and, accordingly, a wider range of adjustment is possible. Further, alternate pistons are shown in FIGS. 3 and 4. In FIG. 3 a square piston 111 is provided. With a square piston moving reciprocally in a square bore, light impinged against the piston in the direction indicated by the arrow would have to pass two corners before it could be received by the light actuated photocell resistor. The squared corner light path thus required materially reduces the incidents of stray signal indications. Where this form of piston is used, the clearances between piston and bore can be greater.

A further piston shape is shown in FIG. 4. This piston 121 which has crenulated lateral walls 122 is intended for use in a central bore having similarly grooved sidewalls. For this piston and sidewall combination, the path for light transmission is even more divergent, and, accordingly, stray signals are further eliminated.

Figure 5:
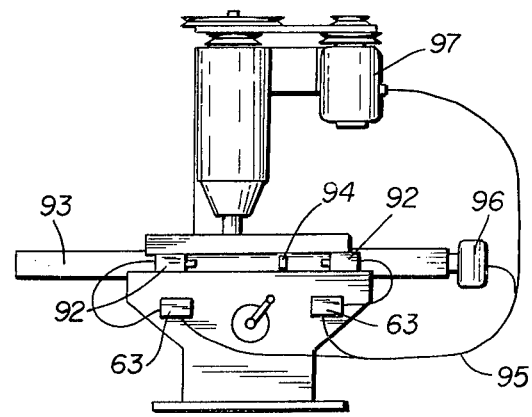
FIG. 5 is a front elevation indicating use of the air switch in a machine tool application.

The air switch embodiments set forth can be used in various ways in order to obtain position indications or to derive control or counting input signals. FIG. 5 illustrates the use of air switches 63 on a machine tool to provide limit controls. If dashpots 92 are positioned adjacent a moving table 93 so that a limit block 94 will come into contact with a moving piston or diaphragm of the dashpot components, an air pulse will be transmitted to the air switches 63. A resulting output electrical signal can be carried by the wires 95 to a table control motor 96 or the main drive motor 97.

Figure 6:
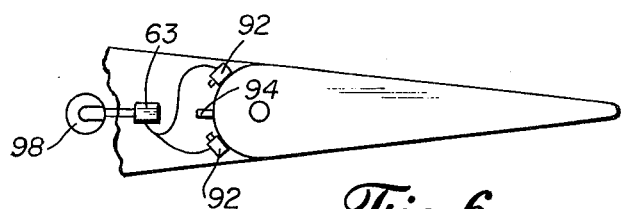
FIG. 6 is a partial side cross-sectional elevation showing use of the air switch as a position indicator.

A remote position indicator is provided by the installation shown in FIG. 6. Here dashpot components 92 are contacted when the limit block 94 is moved to alternate positions. The output signal from the air switches 63 can provide a remote lighted signal at a lamp 98.

Figure 7:
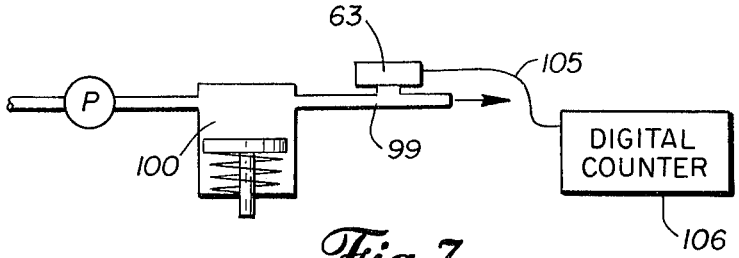
FIG. 7 is a schematic diagram showing use of the air switch as a counter input.

In FIG. 7 the air switch 63 is used in the exhaust outlet 99 of an air cylinder 100. Each time fluid is discharged from the air cylinder 100 an electric pulse can be transmitted from the air switch via the line 105 to a counter mechanism 106. The air switch of this invention can also be used directly in conjunction with pneumatic logic circuits to provide an electric signal output that is related to pressure input or flow changes.

One further and primary use of the present air switch embodiment will be explained with reference to FIG. 8 wherein the air switch 63 is used in substitution for the previous diaphragm type of air switch shown and illustrated in the mentioned previous U.S. Pat. No. 3,790,167.

Figure 8:
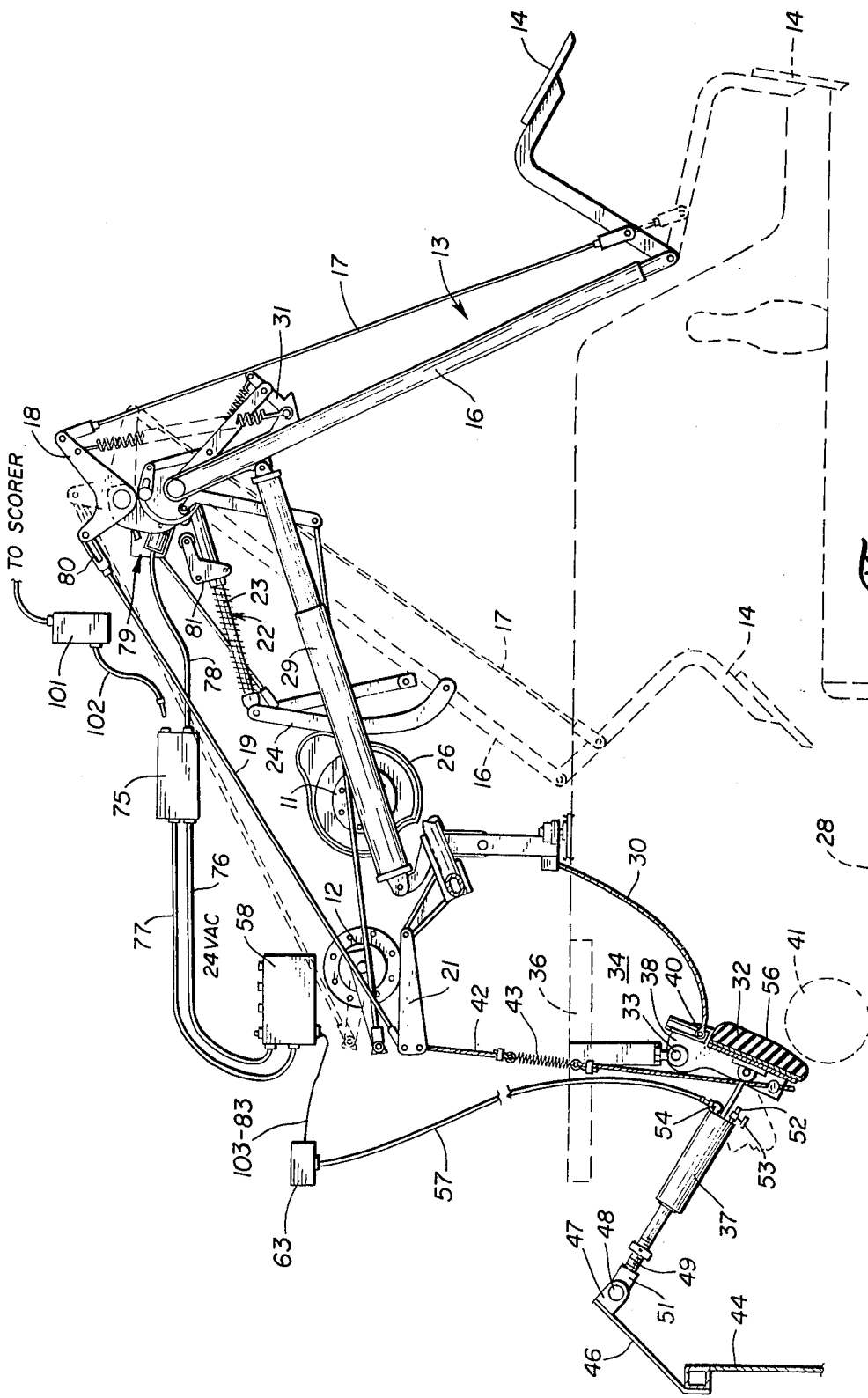
FIG. 8 is a side elevation showing use of the air switch on a bowling pinsetter machine.

The components shown in FIG. 8 are characteristic of the Brunswick A-2 type pinsetter machines, but it is believed that a description of the invention as used in connection with this type of apparatus will also serve to introduce principles of the invention that are also adaptable for other pinsetter installations. Significant original parts and components of an A-2 type mechanism illustrated include a rake lift cam 11, a crank arm housing 12 and a lane rake assembly 13, inclusive of the rake board 14, a support arm 16 and rake lift control rod 17. The rod 17 is connected to one arm of a pivoting crank 18 or "V" levers, while another arm is joined by a cushion link rod 19 to a triangular plate follower 21. This plate in the original installation is connected to the pit cushion so that when the support arm 16 for the rake 14 drops the pit cushion will be elevated. The operational dropping of the rake is still controlled by a rake latch or "shotgun" machanism 22 which locks a rake trip shaft 23 in its extended configuration in order to facilitate return of the rake to its elevated position when its cyclic operation has been completed. A rake cam follower 24 is engaged by the lobe 26 of the cam 11 to accomplish such rake return operations. When the rake is returned to its elevated position, the pit cushion will be lowered into operative ball receiving position in the pit 28 of the bowling machine apparatus. Other conventional elements include the compression spring assembly in its spring guide tube 29, a pit curtain 30, and the rake return sweep hook mechanism 31.

Elements that are changed in keeping with the invention set forth in U.S. Pat. No. 3,790,167 are also presented in the FIG. 8 illustration. The pit cushion 32 is now supported for pivotal movement by a ball joint pivot 33 that is itself held in position on the pit kickbacks or sidewalls 34 by a mounting frame 36. A dashpot cylinder 37 is disposed behind the pit cushion and connected thereto in position below the pivot provided by the ball joint 33 in order to absorb ball and pin impact forces.

Counterweight assemblies 38 disposed at the ends of the pit cushion interconnect the previously provided pit cushion to the ball joint pivots 33. By reason of the positioning of the pivot and the forwardly extending weight 40 of the counterweight assembly 38, the pit cushion is held at a rearwardly inclined angle in order to more efficiently receive and absorb impact forces directed against the pit cushion by a ball 41. In place of the rigid rod previously used to interconnect the plates 21 and the pit cushion 32, a cable 42 is used. A spring 43 is connected to the cable 42 to provide an overtravel capability. Two dashpot cylinders 37 which operate as shock absorbers are mounted on the rear wall 44 of the bowling machine apparatus through use of support brackets 46 having forked standards 47 and through pins 48. An adjustment is provided whereby the effective length of the cylinders 37 may be changed through use of threaded shafts 49 and the shaft receiving clevises 51. A controlled escape orifice is provided for the dashpot cylinder 37 by the bleed element 52, which incorporates an adjusting element 53 for regulating the rate of air escape. A separate elbow connection 54 also communicates with the air chamber within the cylinder 37, and it likewise provides an escape passage for the air of increased pressure that may accumulate within the dashpot 37.

The original pit cushions are used in this A-2 type configuration, but the suspension is changed through use of the end counterweights 38 and the associated pivots 33. The extra forwardly disposed weight 40 and the pivot positions cooperate together with length adjustments for the dashpots 37 to hold the pit cushions 32 in an "at rest" position that is forwardly inclined from the rear of the bowling machine. Preferably the forward face 56 of the pit cushion is also slightly relieved along its lower extent so that the combined positioning and shape of the cushion 32 will be effective to receive and absorb the impact from a bowling ball and to redirect the ball downwardly onto the pit conveyor carpet disposed at the bottom of the pit 28. As soon as a ball or bowling pin impacts against the cushion 32, the cushion will be moved by such impact about its suspension pivots 33, and the cylinder 37 will be at least slightly compressed. When the barrel of the cylinder 37 is moved rearwardly, air will be compressed within the dashpot cylinder. Even a slight compression of such air will permit air to be expelled from the bleed orifice 52 while additional air is expelled through the elbow connector 54. It is the air which escapes through the elbow connector 54 that is used to initiate cyclic operations of the bowling machine itself.

A tube 57 is connected to the elbow 54 to deliver any flow of air to an air switch 63. If an air switch 63 of the type shown in FIG. 1 is used in substitution for the previous air switch shown and described in such patent, air pulses delivered by the tube 57 will cause the release of electric signals through the cable 103-83 to the control panel 58 to actuate the time delay components, etc. as disclosed in the previous patent. An initiate signal will then be delivered through cable 77 back to the pinsetter control box 75, and thence by use of the cable 78 to the solenoid assembly 79 disposed on a C lever or hook of the rake control unit. Actuation of the solenoid releases the rake trip latch 81 of "shotgun" assembly 22 to drop the rake 16 and to thus further actuate cyclic operations of the pinsetter machiner.

Further operations and advantages of a pinsetter machine incorporating these components and features will be as set forth in the mentioned earlier patent. In keeping with such operations, however, it should be noted that the signal derived from the use of the present air switch 63 can also be used to directly actuate automatic scoring apparatus. In the illustration of this beneficial usage, an auxiliary cable 102 is shown for interconnecting the pinsetter control box 75, and any air switch derived signal delivered to box 75 can be further transmitted to actuate an automatic scorer installation 101. With this arrangement a signal can be passed to an automatic scorer in place of being delivered to the solenoid 86, or where automatic scorers are used on a machine together with the previously described solenoid actuated rake release components, duplicate electrical circuits can be interconnected to the air switch components.

Actually the range of pressure differentials that must be accommodated by air switch 63 are substantial considering the different impact values that are encountered. In order to provide adequate machine control, the machine must be cycled at any time that a bowling ball is received in the pit. Accordingly, there must be a sufficient increment in pressure resulting from the movement of a ball backwardly against the pit cushion due simply to the motion imparted to the ball by the pit conveyor carpet used in such pit. With the described system even a light touching between the ball and the pit cushion will cause a signal to be delivered by the tube 57 that is adequate to close the air switch to thereafter initiate operation of the bowling machine. Similarly, the machine operations can be initiated when the pit cushion is struck by a pin rather than by the bowling ball itself.

The air switch embodiment of the present invention is more readily adaptable for the described pinsetter use, since the sensitivity of this new air switch can be more closely adjusted. In addition to changes in the size, material and, accordingly, the weight of the piston, the rate of the spring 73 and its operative length can also be adjusted and changed. The spring force can, of course, be further regulated so that the air switch can be used in other than the upright position shown with the spring providing a correction for gravity influences.

Since the switch body can be of relatively strong construction, the air switch can be used for a wide range of varied pressure installations. A switch body made of plastic has been tested at pressures of up to 120 p.s.i. At higher pressure levels the switch would be best adapted for use to provide a signal based on changes in differential pressure. For such installations the pressure influences to be balanced will be interconnected to the air fitting 65 and to the threaded central bore 84 of the adjustment plug 68.

We claim:
1. A swich providing an output electrical signal for use in fluid systems to indicate pressure variances in said system comprising a body providing a main bore and an intersecting light transmitting cross bore therein, a piston of size and conformation corresponding to the size and conformation of said main bore reciprocally received in said main bore for movement therealong to alternate positions of light blocking interference and non-interference with respect to said cross bore, photocell resistor light sensitive means in said cross bore at one side of said main bore for providing a changed output electrical signal when exposed to light transmitting through said cross bore to said light sensitive means, a light source in said cross bore at the opposite side of said main bore for directing light along said cross bore and toward said light sensitive means for the actuation thereof, means for introducing fluid system pressure influences to at least one side of said piston, and electric circuit means connected to said light sensitive means whereby changed output electric signals are transmitted from said switch as the piston is moved to interfering and non-interfering positions by pressure changes in said fluid system.

2. The signal switch as set forth in claim 1 wherein the piston and main bore are cooperatively formed of rectangular cross-section whereby the light path from said light source to said light sensitive means and past said piston is angular.

3. The signal switch as set forth in claim 1 wherein said light source is a light emitting diode.

4. A signal switch as set forth in claim 1 wherein a fluid inlet is provided as said fluid introduction means for introducing pressure influences on one side of said piston, and further comprising resilient means disposed on an opposite side of said piston for resisting movement thereof and adjustment means for varying the resilient force applied whereby the switch is adaptable for use at varied pressure levels.

5. The signal switch as set forth in claim 1 wherein said piston and main bore have crenulated sidewalls at positions transverse to and intercepting the light path from the light source to said light sensitive means whereby the light path from said light source to said light sensitive means and past said piston is multi-angular to reduce the occurrence of erroneous signal incidents.

6. The signal switch as set forth in claim 1 wherein the switch is disposed in position whereby gravity influences move the piston toward an interference position, and further comprising means for changing the weight of said piston whereby the switch is adaptable for use at varied pressure levels.

7. A signal switch as set forth in claim 6 wherein a fluid inlet is provided as said fluid introduction means for introducing pressure influences on one side of said piston, and further comprising resilient means disposed on an opposite side of said piston for resisting movement thereof and adjustment means for varying the resilient force applied whereby the switch is adaptable for use at varied pressure levels.

* * * * *